US007786665B2

(12) United States Patent
Nakanishi et al.

(10) Patent No.: US 7,786,665 B2
(45) Date of Patent: Aug. 31, 2010

(54) ORGANIC ELECTROLUMINESCENT DEVICE HAVING A DIFFRACTION GRATING FOR ENHANCING LIGHT EXTRACTION EFFICIENCY

(75) Inventors: Tsutomu Nakanishi, Tokyo (JP); Toshiro Hiraoka, Yokohama (JP); Akira Fujimoto, Kawasaki (JP); Koji Asakawa, Tokyo (JP); Satoshi Saito, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 728 days.

(21) Appl. No.: 11/319,508

(22) Filed: Dec. 29, 2005

(65) Prior Publication Data
US 2006/0192483 A1 Aug. 31, 2006

(30) Foreign Application Priority Data
Jan. 6, 2005 (JP) .............................. 2005-001725

(51) Int. Cl.
*H01L 21/00* (2006.01)
*H01L 35/24* (2006.01)
*H05B 33/22* (2006.01)
*H01L 29/08* (2006.01)

(52) U.S. Cl. .................. 313/504; 313/506; 257/40; 438/29

(58) Field of Classification Search ................ None
See application file for complete search history.

(56) References Cited

U.S. PATENT DOCUMENTS 5,473,448 A * 12/1995 Yoshinaga et al. ............ 349/89
6,476,550 B1 * 11/2002 Oda et al. .................... 313/504
6,630,684 B2 * 10/2003 Lee et al. ..................... 257/40
6,787,796 B2 * 9/2004 Do et al. ...................... 257/40
2003/0180023 A1 * 9/2003 Hamada ...................... 385/130

FOREIGN PATENT DOCUMENTS

| JP | 6-151061 | 5/1994 |
| JP | 11-283751 | 10/1999 |
| JP | 2003-100458 | 4/2003 |
| JP | 2003-109749 | 4/2003 |
| JP | 2003-257620 | 9/2003 |

* cited by examiner

*Primary Examiner*—Sikha Roy
*Assistant Examiner*—Tracie Green
(74) *Attorney, Agent, or Firm*—Oblon, Spivak, McClelland, Maier & Neustadt, L.L.P.

(57) ABSTRACT

An organic electroluminescent device is provided, which includes an emission portion comprising a first electrode and a second electrode and an organic layer sandwiched between the first and second electrodes, and a diffraction grating disposed neighboring on the emission portion, the diffraction grating having first regions and a second region, the first regions comprising a plurality of pair of recessed and projected portions, the plurality of pair of recessed and projected portions being periodically arranged and provided with a primitive translation vector of a direction, the second region comprising an aggregate of the first regions and located parallel with an emission surface of the organic electroluminescent device.

10 Claims, 4 Drawing Sheets

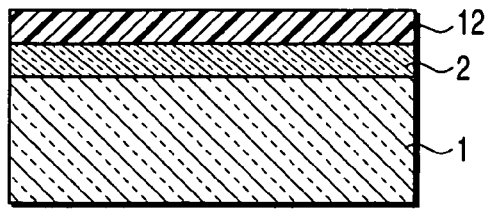
F I G. 12
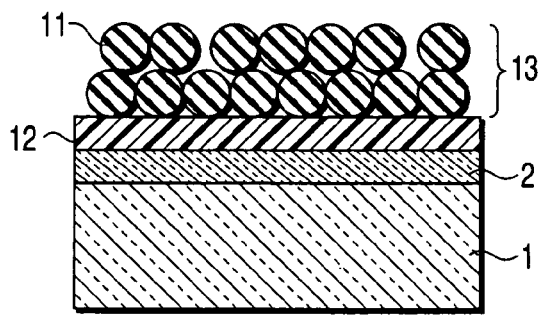
F I G. 13
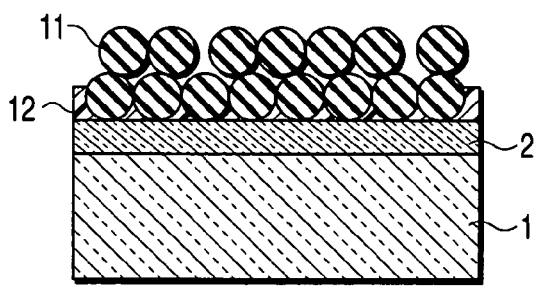
F I G. 14
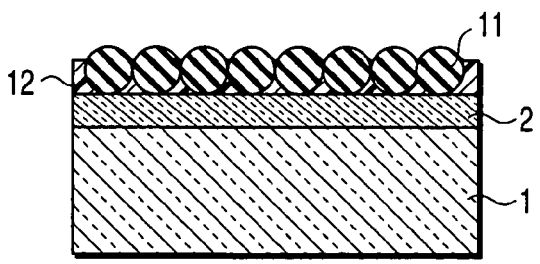
F I G. 15
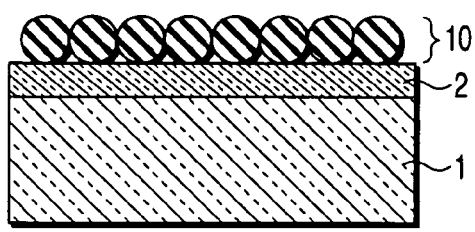
F I G. 16

ORGANIC ELECTROLUMINESCENT DEVICE HAVING A DIFFRACTION GRATING FOR ENHANCING LIGHT EXTRACTION EFFICIENCY

CROSS-REFERENCE TO RELATED APPLICATIONS

This application is based upon and claims the benefit of priority from prior Japanese Patent Application No. 2005-001725, filed Jan. 6, 2005, the entire contents of which are incorporated herein by reference.

BACKGROUND OF THE INVENTION

1. Field of the Invention

This invention relates to an organic electroluminescent device and to a method for manufacturing the organic electroluminescent device.

2. Description of the Related Art

In order to enhance the light extraction efficiency in an organic electroluminescent device (organic EL device), there has been conventionally proposed a technique of forming a diffraction grating inside the EL device. The guided light inside the EL device is diffracted by the diffraction grating before it is retrieved from the EL device. As a result, it is possible to enhance the light extraction efficiency as compared with the EL device which is not provided with the diffraction grating. However, in the case of organic EL device where a diffraction grating having the same periodic axis throughout the entire region of emission surface is provided, non-uniformity in luminance generates in the direction of emission surface, so that such an organic EL device is not suited for use in a display device where uniformity of luminance in the emission surface is required.

The aforementioned diffraction grating is usually formed inside the organic EL device by a process comprising a photolithography step, etc., which is generally employed in a fine working of semiconductor device. In the formation of a pattern of fine recessed and projected portions, especially a very fine pattern where the pitch thereof is 1 μm or so, it is required to employ an expensive apparatus and a complicated process, thus raising a problem that the manufacturing cost of organic EL device would become very high.

There has been also proposed a technique of enhancing the light extraction efficiency through the control of the guided light in the organic EL device, wherein a light diffusion layer is provided in a transparent matrix and particles having a different refractive index from that of the matrix are dispersed in the light diffusion layer. The light emitted at the emission portion scatters by the particles arranged at random in the matrix, thereby suppressing the guided light in the EL device. In this case, it is possible to prevent the luminance from becoming non-uniform in the emission surface. However, due to the particles arranged at random in the matrix, the light emitted in the direction perpendicular to the substrate at the emission layer also scatters in various directions raising a problem that the front face luminance is prominently degraded.

Therefore, there is persistent demand to enhance the light extraction efficiency of the organic EL device without deteriorating the uniformity of luminance in the emission surface.

BRIEF SUMMARY OF THE INVENTION

An organic electroluminescent device according to one aspect of the present invention comprises an emission portion comprising a first electrode and a second electrode and an organic layer sandwiched between the first and second electrodes; and a diffraction grating disposed neighboring on the emission portion, the diffraction grating having first regions and a second region, the first regions comprising a plurality of pair of recessed and projected portions, the plurality of pair of recessed and projected portions being periodically arranged and provided with a primitive translation vector of a direction, the second region comprising an aggregate of the first regions and located parallel with an emission surface of the organic electroluminescent device.

A method for manufacturing an organic electroluminescent device according to one aspect of the present invention comprises preparing a substrate having a base material layer at a surface; forming a particle monolayer above the base material layer, the particle monolayer having a second region consisting of an aggregate of first regions, each of the first regions containing particles which are periodically arranged and provided with a primitive translation vector of a predetermined direction; forming recessed and projected portions on the base material layer by working the surface of base material layer with the particle monolayer being employed as an etch mask; filling the recessed portions of the recessed and projected portions with a medium having a different refractive index from that of the substrate, thereby obtaining a diffraction grating above the substrate; and forming an emission portion having an organic layer interposed between a first electrode and a second electrode above the diffraction grating.

A method for manufacturing an organic electroluminescent device according to a another aspect of the present invention comprises preparing a substrate having a base material layer at a surface; forming a pattern transfer layer above the base material layer; forming a particle monolayer on the pattern transfer layer, the particle monolayer having a second region containing an aggregate of first regions, each of the first regions comprising particles which are periodically arranged and provided with a primitive translation vector of a predetermined direction; transcribing a pattern of the particle monolayer to the pattern transfer layer with the particle monolayer being employed as an etch mask; forming recessed and projected portions on a surface of base material layer by working the surface of base material layer with the pattern transfer layer having the pattern of the particle monolayer being employed as an etch mask; filling the recessed portions of the recessed and projected portions with a medium having a different refractive index from that of the substrate, thereby obtaining a diffraction grating; and forming an emission portion having an organic layer interposed between a first electrode and a second electrode above the diffraction grating.

BRIEF DESCRIPTION OF THE SEVERAL VIEWS OF THE DRAWING

FIG. 12 is a cross-sectional view illustrating a step next to the step shown in FIG. 11;

FIG. 13 is a cross-sectional view illustrating a step next to the step shown in FIG. 12;

FIG. 14 is a cross-sectional view illustrating a step next to the step shown in FIG. 13;

FIG. 15 is a cross-sectional view illustrating a step next to the step shown in FIG. 14;

FIG. 16 is a cross-sectional view illustrating a step next to the step shown in FIG. 15.

DETAILED DESCRIPTION OF THE INVENTION

Next, embodiments of the present invention will be explained with reference to drawings.

Figure 1:
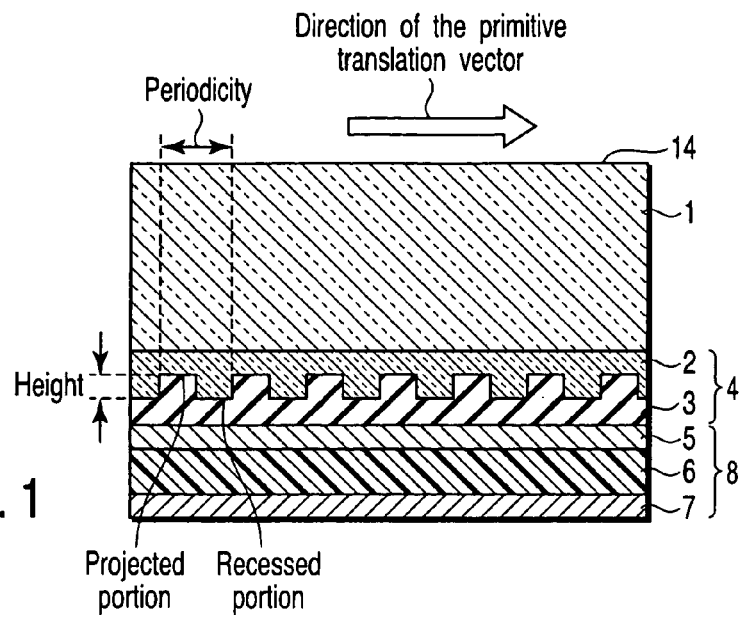
FIG. 1 is a cross-sectional view of an organic EL device according to one embodiment of the present invention.

The cross-sectional view representing the structure of an organic EL device according to one embodiment of the present invention is shown in FIG. 1. Namely, FIG. 1 illustrates merely a typical example to help an artisan to understand one embodiment of the present invention, so that it is needless to say that the organic EL device according to one embodiment of the present invention is not limited to the structure shown in FIG. 1.

As shown in FIG. 1, the organic EL device according to one embodiment of the present invention comprises a substrate 1, a diffraction grating portion 4, and a light emitting portion 8. In the example shown in FIG. 1, although the diffraction grating portion 4 and the light emitting portion 8 are successively stacked on the substrate 1, an other layer, such as a protective layer may be interposed between the substrate 1 and the diffraction grating portion 4, or between the diffraction grating portion 4 and the light emitting portion 8.

The organic EL device shown in FIG. 1 is of a bottom emission type structure where light is emitted as surface-emission from the substrate side. In this case, the surface of the substrate 1 serves as a light emission surface 14. As for the substrate 1, it is possible to employ any material such as a glass substrate which is transparent to visible light. With respect to the thickness of the substrate 1, there is not any particular limitation. If the substrate side is not employed as a light emission surface, the substrate 1 may be constituted by any suitable material such as a glass substrate, a plastic substrate, a semiconductor substrate, etc.

The light emitting portion 8 is constituted by a first electrode 5, a second electrode 7, and an organic layer 6 interposed between the first electrode 5 and the second electrode 7. One of the first electrode 5 and the second electrode 7 is employed as an anode and the other as a cathode. Since the anode plays a role of injecting a hole into the organic layer 6, the anode should preferably be constituted by a material having a work function of 4.0 eV or more. Although there is not any particular limitation, the anode can be formed using metal or metal oxide such, for example, as indium tin oxide alloy (ITO), tin oxide, zinc oxide, gold, silver, platinum, copper, etc., or a mixture thereof. On the other hand, since the cathode plays a role of injecting an electron, the cathode should preferably be constituted by a material which is relatively small in work function. Although there is not any particular limitation, examples of the material for the cathode include indium, aluminum, magnesium, lithium, scandium, or a mixture of these materials.

Among the first electrode 5 and the second electrode 7, the electrode to be disposed on the light emission surface side should preferably be transparent to emission spectrum. As for the thickness of these electrodes 5 and 7, there is not any particular limitation as long as the thickness thereof is sufficient enough to enable the electrodes to exhibit the inherent function as an electrode. For example, the thickness of these electrodes 5 and 7 may range from 0.01 μm to 5 μm.

The organic layer 6 may be a stacking structure additionally comprising an active layer and interposed between the first electrode 5 and the second electrode 7. The active layer in this case means a region where a hole is enabled to couple with an electron. For example, in order to enhance the coupling efficiency between a hole and an electron, the organic layer may further include, other than the active layer, a hole transport layer and/or an electron transport layer. In this case, the hole transport layer is inserted between the active layer and the anode, and the electron transport layer is inserted between the active layer and the cathode. With respect to the materials for the active layer, the hole transport layer and the electron transport layer, there is not any particular limitation. Namely, any kinds of materials can be employed as long as the materials are those which are commonly employed as an active layer, a hole transport layer or an electron transport layer in the organic EL device.

As for the active layer, it is possible to employ, for example, tris(8-quinolinol)aluminium complex (Alq3), bisdiphenyl vinylbiphenyl (BDPVBi), 1,3-bis(p-t-butylphenyl-1,3,4-oxadiazolyl)phenyl (OXD-7), N,N'-bis(2,5-di-t-butylphenyl) perylene tetracarboxylic acid diimide (BPPC), 1,4-bis(p-tolyl-p-methylstyrylphenylamino)naphthalene, etc.

As for the hole transport layer, it is possible to employ, for example, bis(di(p-tolyl)aminophenyl)-1,1-cyclohexane, TPD, triphenyl diamines such as N,N'-diphenyl-N,N'-bis(1-naphtyl-1,1'-biphenyl)-4,4'-diamine (α-NPD), a star-burst type molecule, etc.

Further, as for the electron transport layer, it is possible to employ, for example, 2-(4-biphenylyl)-5-(4-t-butylphenyl)-1,3,4-oxadiazole (Bu-PBD), oxadiazole derivatives such as OXD-7, triazole derivatives, and quinolinol-based metal complex.

Although there is not any particular limitation with respect to the thickness of the organic layer 6, it is preferable, as generally adopted, to confine it within the range of 0.01 μm to 1 μm.

Figure 2:
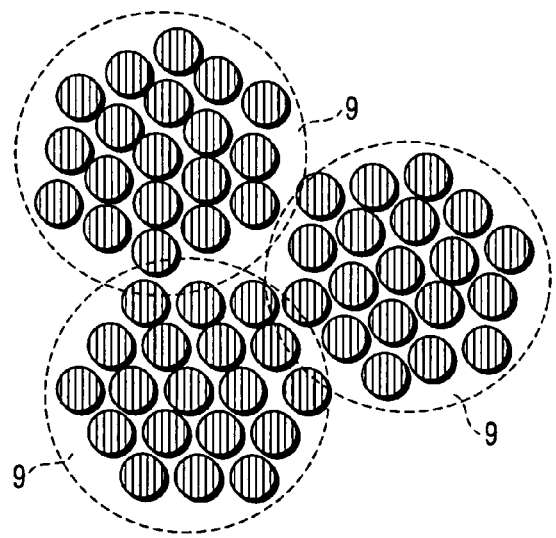
FIG. 2 shows a pattern of recessed and projected portions in the diffraction grating of the organic EL device of the present invention.

The diffraction grating portion 4 is constituted by a base material layer 2 having recessed and projected portions, and a medium 3 deposited on the base material layer 2 so as to bury the recessed portions of the recessed and projected portions. Next, the features of the recessed and projected surface of the base material layer 2 will be explained with reference to FIG. 2. As shown in FIG. 2, the recessed and projected surface of the base material layer 2 constitutes a second region consisting of an aggregate of first regions 9. The recessed and projected portions of each of the first regions 9 are arranged with two-dimensional periodicity in the direction parallel with the substrate and with a primitive translation vector of a predetermined direction. FIG. 2 shows three groups of the first regions 9, wherein the direction of the primitive translation vector of the recessed and projected portions of each of the first regions 9 is not identical with each other, thus differing from each other. The recessed and projected portions are arranged in this manner in each of the first region, and, due to this arrangement, it is now possible to minimize the non-uniformity in luminance of emission, thus realizing the effect of enhancing the uniformity in luminance of emission. With respect to the method of forming such recessed and projected portions will be explained hereinafter.

With respect to the configuration of the recessed and projected portions of the first regions 9, there is not any particular limitation as long as the recessed and projected portions are arranged with two-dimensional periodicity in the surface of the substrate. Thus, the recessed and projected portions of the first regions 9 may be arranged in a configuration of triangular or rectangular grating. Further, the shape of each of the recessed and projected portions may be simple protrusion-like or columnar. Although the intervals of the recessed and projected portions of the first regions 9 may be selected from the range of 0.1 μm to 5 μm, a specific periodicity of the recessed and projected portions should preferably be determined by considering the wavelength of emitted light or the waveguide angle of guided light in the EL device as described hereinafter.

The intervals of the recessed and projected portions of the first regions 9 should preferably be confined within the range of 80% to 120% of an average interval between the recessed and projected portions in the first regions 9. The height of the projected portions influences the diffraction efficiency of the guided light waveguided in the EL device. Namely, the higher the diffraction efficiency is, the higher the light extraction efficiency would become. In order to secure a high diffraction efficiency of the guided light, the height of the projected portions should preferably be not less than 50 nm. On the other hand, in the viewpoint of convenience of creating the recessed and projected portions, the height of the projected portions should preferably be confined to not more than 20 μm. The height of the projected portions in the first regions 9 should preferably be confined within the range of 80% to 120% of an average height of the projected portions in the first regions 9.

As long as the recessed and projected portions provided in the first regions 9 are formed in such a manner that there are at least five projected portions disposed in the direction of each primitive translation vector in each of the first regions 9, it is possible to minimize the non-uniformity in luminance of emission, thus realizing the uniformity in luminance of emission. In order to further enhance the light extraction efficiency, it is more preferable that there are at least ten projected portions disposed in the direction of each primitive translation vector. Furthermore, in order to prevent the generation of non-uniformity in luminance of emission in the light-emitting surface, the number of projected portions disposed sequentially in the direction of primitive translation vector should preferably be confined to not more than 5000, more preferably not more than 1000. In this case, the number of projected portions among the neighboring first regions 9 may not necessarily be the same with each other, but may differ from each other in any manner.

The material constituting the diffraction grating portion 4 should desirably be transparent to the emission spectrum. The recessed and projected portions in the diffraction grating portion 4 may be formed directly on the substrate 1. Alternatively, the recessed and projected portions may be formed on a base material layer 2 which is transparent to the emission spectrum and deposited on the substrate 1. Thus, the base material layer 2 may be a surface portion of the substrate 1 or may be constituted by a material which differs from the material constituting the substrate 1. The recessed portions of the recessed and projected portions are then filled with a medium 3 having a different refractive index from that of the base material layer 2 where the recessed and projected portions are formed, thus forming the diffraction grating portion 4. Even if the recessed portions are filled directly with a transparent electrode material, it is possible to obtain the effect of homogenizing the emission luminance. However, once a step portion is generated on the surface of the transparent electrode due to the recessed and projected portions, an concentration of the electric field generates at the step portion of electrode, thereby giving rise to the deterioration of organic material included in the light emission layer. In order to obviate such problems and to manufacture an organic EL device of long life, it is preferable to perform the filling of the recessed portions by using a different material from that of the transparent electrode material.

With respect to such a material suited for filling the recessed portions, there is not any particular limitation as long as the material is hardly capable of absorbing the emission spectrum and, hence, the material can be suitably selected from organic materials, inorganic materials and organic-inorganic composites. Specific examples of organic materials useful in this case include, for example, organic polymer materials such as polystyrene and derivatives thereof, acrylic resin, silicone resin, novolac resin, etc. Specific examples of inorganic materials useful in this case include, for example, metal oxides such as silica, alumina, titanium oxide, zinc oxide, zirconia, etc. Specific examples of organic-inorganic composites useful in this case include, for example, resins having particles of metal oxide dispersed therein, specific examples of metal oxide including titanium oxide, cerium oxide, magnesium oxide, zinc oxide, etc.

Figure 3:
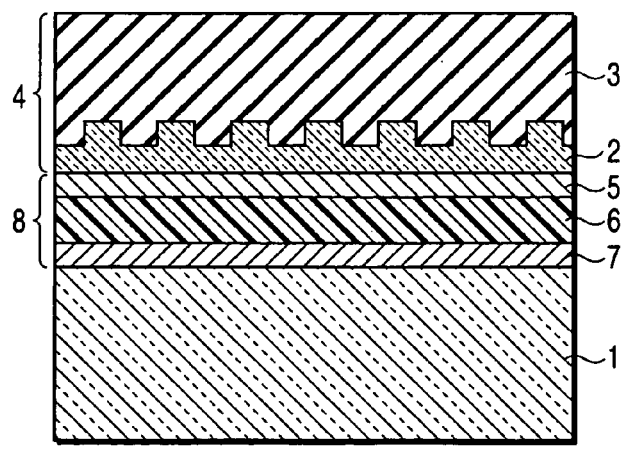
FIG. 3 is a cross-sectional view of an organic EL device according to another embodiment of the present invention.

The organic EL device according to one embodiment of the present invention may be formed not only of a bottom emission type structure but also of a top emission type structure. FIG. 3 shows a cross-sectional view of one example of the top emission type structure. As shown in FIG. 3, a light emitting portion 8 and a diffraction grating portion 4 are successively formed on the substrate 1. If required, a protective layer may be interposed between the diffraction grating portion 4 and the light emitting portion 8 by plasma CVD method, etc. The light emitting portion 8 is constituted by a first electrode 5, an organic layer 6 and a second electrode 7, wherein the same structure and the same materials as those employed in the bottom emission type organic EL device may be employed.

The organic EL device according to one embodiment of the present invention is capable of emitting light at a high light extraction efficiency without generating a luminance distribution in the light emission surface. Further, there is no possibility of considerably deteriorating the front luminance in this case. The reason for this can be ascribed to the fact that the organic EL device according to one embodiment of the present invention comprises a specific kind of diffraction grating in the device. More specifically, the diffraction grating comprises a second region consisting of an aggregate of first regions and located parallel with an emission surface, each of the first regions comprising recessed and projected portions which are periodically arranged and provided with a primitive translation vector of a predetermined direction.

Due to the region in an organic EL device, where the recessed and projected portions are arranged with two-dimensional periodicity in the surface of the substrate, the following effects can be obtained. Namely, the guided light that cannot be ordinarily guided and extracted out of the EL device would be now enabled to be diffracted in the direction perpendicular to surface of the substrate due to the aforementioned periodic structure. As a result, it is now possible to suppress the guided light and to externally emit the light, thus making it possible to enhance the light extraction efficiency.

In this case, the periodicity of the recessed and projected portions should preferably be determined as follows. Incidentally, the expression "periodicity of the recessed and projected portions" means a distance between neighboring projected portions in the direction of primitive translation vector in the first region. It is known that the guided light in the interior of the EL device can be characterized by various parameters such as the width of waveguide layer, the refractive indexes of a couple of neighboring clad layers and of waveguide layer, the wavelength of guided light, etc. When the periodicity ($\Lambda$) of the recessed and projected portions of the diffraction grating portion is represented by the following equation (1), the guided light will be diffracted in the direction perpendicular to the surface of the substrate.

$$\Lambda = v \cdot \lambda / n \cdot \sin \theta m \quad (1)$$

(wherein $\lambda$ represents the wavelength of guided light in vacuum, n represents the refractive index of the waveguide layer, $\theta m$ represents the reflected angle of the guided light of m th order, and v is an integer.)

Therefore, the recessed and projected portions that have been formed with a periodicity which meets the relationship represented by the aforementioned equation (1) would make it possible to enable the light that has been conventionally wave-guided only inside the EL device to be diffracted in the direction perpendicular to the surface of the substrate. In particular, it is preferable to determine the periodicity of the recessed and projected portions in such a manner that the diffracted light where the value of v is −1 (i.e. a diffracted light of (−1)-order) can be generated in the direction perpendicular to the surface of the substrate. The reason for this is due to the fact that the diffraction efficiency of (−1)-order is higher as compared with the diffraction efficiency of light of other orders and hence the increasing ratio of the light extraction efficiency becomes most prominent. However, when the recessed and projected portions have the same primitive translation vector throughout the entire surface of the substrate, a problem will be raised that non-uniformity in luminance would be generated in the distribution of luminance in the emission surface.

Since the light to be generated in a certain location in the emission layer inside the organic EL device is random in directionality, it may be assumed that the light will be radiated spherically with a uniform intensity distribution. As a result, the light that enters into the diffraction grating portion at a specific angle to an axis perpendicular to the emission surface is enabled to enter into the diffraction grating portion at a uniform distribution of intensity in the emission surface and then diffracted by the recessed and projected portions of the diffraction grating portion.

Figure 4:
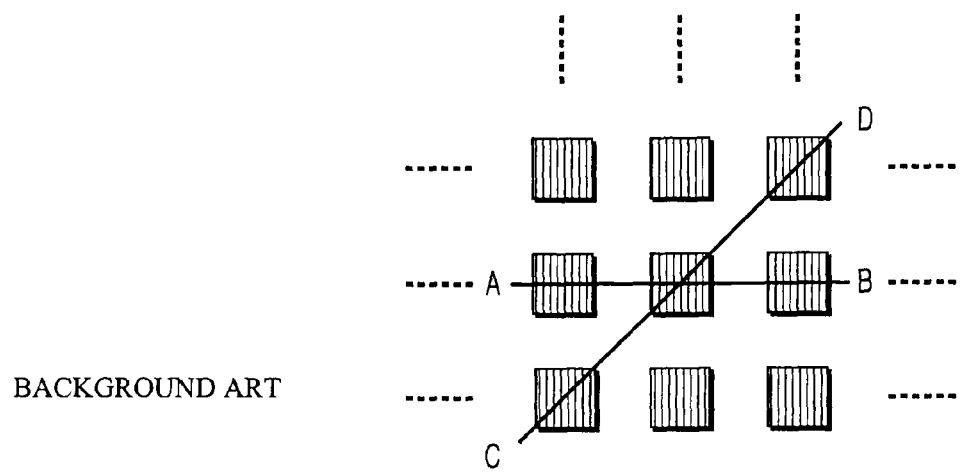
FIG. 4 shows a pattern of recessed and projected portions in the diffraction grating of the organic EL device of the prior art.

The direction and intensity of diffraction at the diffraction grating portion will be explained with reference to FIG. 4. In the case of the diffraction grating portion shown herein, the recessed and projected portions are arranged in a configuration of rectangular grating wherein the intervals of the recessed and projected portions in the direction of A-B differ from the intervals thereof in the direction of C-D. Therefore, the direction as well as the intensity of diffraction in the direction of A-B differs from those in the direction of C-D. These differences are not necessarily limited to the recessed and projected portions which are arranged in a configuration of rectangular grating but also applicable to other structures of the recessed and projected portions where the recessed and projected portions are arranged in any optional periodicity. As a result, when the recessed and projected portions of the diffraction grating portion have the same primitive translation vector throughout the entire emission surface, non-uniformity in luminance in the emission surface would be generated depending on the structure of periodicity.

The present inventors have found out that it is possible to obtain an organic EL device which is capable of minimizing the non-uniformity in emission luminance and excellent in light extraction efficiency by providing the EL device with a diffraction grating portion therein, the diffraction grating portion comprising a second region consisting of an aggregate of first regions, each of which comprising recessed and projected portions which are periodically arranged and provided with a primitive translation vector of a predetermined direction. As described above, the guided light in the EL device is diffracted in the vertical direction by the first region having two-dimensional periodicity and then radiated out of the EL device. Further, according to this embodiment of the present invention, since there is provided the second region comprising a plurality of first regions each neighboring on others and differing in primitive translation vector from others, the direction of diffraction as well as the distribution of diffraction intensity in the emission surface will be homogenized. As a result, there is no possibility of generating, depending on the structure of periodicity, non-uniformity in luminance in the emission surface.

If the periodicity in the recessed and projected structure is collapsed, the effects of enhancing the light extraction efficiency by the diffraction grating may be generally assumed to be vanished due to the deterioration of diffraction efficiency. However, it has been found out by the present inventors that as long as the first regions are formed with two-dimensional periodicity and each of the first regions comprises a sequence of at least five recessed and projected portions extending in the direction of the primitive translation vector thereof, it is possible to enhance the light extraction efficiency. The principle for this phenomenon will be explained hereinafter.

When there are recessed and projected portions of specific features on the surface to which light is irradiated, the light irradiated thereto will be scattered at specific scattering angles. Further, when light is irradiated to a surface where recessed and projected portions are arranged thereon with periodicity (an aggregate of recessed and projected portions), a scattering light generates at a specific angle, thus generating a diffracted light. Because the scattering light from the aggregate of recessed and projected portions would be a sum of the scattering lights each being created by individual recessed and projected portion. Generally, the intensity I(K) of diffracted light in this case can be expressed by the following equation (2).

$$I(K) = F(K) \cdot F(-K) \cdot Ga^2(K) \cdot Gb^2(K) \quad (2)$$

In the equation (2), K is a diffraction vector; F(K) is a factor of crystal structure; Ga(K) is a Laue function in a two-dimensional periodic structure having a direction of period "a"; and Gb(K) is a Laue function in a two-dimensional periodic structure having a direction of period "b", both Laue functions being represented by the following equations (3) and (4).

$$Ga^2(K) = \sin^2[\pi(2Na+1)(K \cdot a)] / \sin^2[\pi(K \cdot a)] \quad (3)$$

$$Gb^2(K) = \sin^2[\pi(2Nb+1)(K \cdot b)]/\sin^2[\pi(K \cdot b)] \quad (4)$$

In the equations (3) and (4), "a" is a primitive translation vector in the direction of period "a"; "b" is a primitive translation vector in the direction of period "b"; Na is the number of recessed and projected portions in the direction of period "a"; and Nb is the number of recessed and projected portions in the direction of period "b".

The Laue function of the equation (3) is a function which becomes a maximal value when K·a is an integer of optional number wherein the width of maximum peak becomes narrower in inverse proportion to 2Na+1. This trend is also applicable to the equation (4) which is of the same function type as the equation (3). Namely, as the number of recessed and projected portions becomes larger, the sharpness of the intensity of diffracted light would become more prominent. However, when the number of the projected portions in the direction of each of the fundamental translation victor is increased to 5 or more, the fluctuation in width of peak will be substantially vanished. Thus, in order to secure the effects of minimizing the non-uniformity of emission luminance, the number of the projected portions in the direction of the primitive translation vector should preferably be not less than five, more preferably not less than 10.

On the other hand, when the recessed and projected portions are continuously formed more than 5000 in the direction of each of the primitive translation vectors, the non-uniformity of luminance would become visually recognizable in the emission surface. Therefore, the number of the recessed and projected portions in the direction of the primitive translation vector should preferably be confined to not more than 5000, more preferably not more than 1000.

As described above, due to the diffraction grating, most of the guided lights are enabled to diffract in the vertical direction in the organic EL device according to one embodiment of the present invention. As a result, as compared with the conventional EL device where a light diffusion layer is disposed so as to homogenize the luminance in the emission surface, it is possible to prevent the front luminance from being considerably deteriorated.

Since the organic EL device according to one embodiment of the present invention is provided with a diffraction grating of specific structure, it is now possible to minimize the non-uniformity of emission luminance and to enhance the uniformity of luminance, and at the same time, it is possible to enable the EL device to emit at a high light extraction efficiency. The diffraction grating according to one embodiment of the present invention is provided with a second region consisting of an aggregate of first regions and located in an emission surface, wherein each of the first regions comprises recessed and projected portions which are periodically arranged and provided with a primitive translation vector of a predetermined direction.

Since the periodicity of the recessed and projected portions in the first region is of nano-order, an expensive exposure apparatus may be required to be employed, thus increasing the manufacturing cost if it is tried to form the recessed and projected portions by photolithography which is usually employed in fine working of a semiconductor device. However, even if it is tried to employ a pattern-forming method such as a laser interference method which does not necessitate the employment of an expensive exposure apparatus, it is impossible to form a pattern having a second region consisting of an aggregate of first regions and located in an emission surface, each of the first regions comprising recessed and projected portions which are periodically arranged and provided with a primitive translation vector of a predetermined direction. As a result of intensive studies made by the present inventors, it has been found out that a technique of working a base material layer by using, as an etch mask, a particle monolayer aggregated in a self-organized manner is most suited in forming the aforementioned recessed and projected portions in the diffraction grating portion.

As for the method of forming the particle monolayer on a substrate, there is known, as one example, a method of utilizing a capillary force which acts on particles in the course of drying a dispersion liquid of particles (A. S. Dimitov, T. Miwa, K. Nagayama, Langmuir, Vol. 15, p5257; 1999). The particle monolayer formed by using the self-assembly of particles is utilized for forming a periodic sequential pattern of particles through an isotropic intermolecular forces between particles. In this case however, since the self-assembly is utilized, it is difficult to obtain a sequence of particles where the periodic axis thereof is completely made uniform throughout the entire surface of substrate of several square centimeters. In most cases, a defect generates in the middle of aggregation. As a result, it is now possible to obtain a sequence of particles having a second region consisting of an aggregate of first regions, wherein each of the first regions comprises particles which are periodically arranged and provided with a primitive translation vector of a predetermined direction.

It has been found out by the present inventors that it is possible to obtain a desired diffraction grating portion by forming the recessed and projected portions on a base material layer through the employment of, as an etch mask, a particle monolayer that has been formed by using the self-assembly of particles as described above. Further, by setting the diameter of particles to be employed for the formation of etch mask to not more than submicron, it is possible to form a pattern of as fine as not more than submicron, thus resulting in the saving of manufacturing cost.

Next, a method of manufacturing a bottom emission type organic EL device according one embodiment of the present invention will be explained with reference to FIGS. 5 to 10.

Figure 5:
FIG. 5 is a cross-sectional view illustrating one step in the manufacturing method of an organic EL device according to one embodiment of the present invention.

First of all, as shown in FIG. 5, a substrate 1 is prepared. As for the substrate 1, it is possible to employ a glass substrate, etc.

Figure 6:
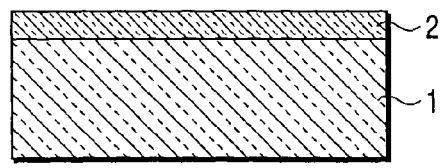
FIG. 6 is a cross-sectional view illustrating a step next to the step shown in FIG. 5.

As shown in FIG. 6, a base material layer 2 for forming recessed and projected portions is deposited on the substrate 1. As for the materials for the base material layer 2, there is not any particular limitation as long as the materials are impermeable to emission spectrum. For example, the base material layer 2 can be formed by using spin-on-glass, etc. As for the method of forming this base material layer 2, it is possible to employ known methods such as a wet processes including a spin-coating method, a dip-coating method, a bar coating method, a sol-gel method, etc.; or a dry processes such as a sputtering method, a vacuum deposition method, a plasma CVD method, etc. Incidentally, when the recessed and projected portions are to be directly formed on a substrate, the deposition of the base material layer 2 for forming the recessed and projected portions would not be required.

Figure 7:
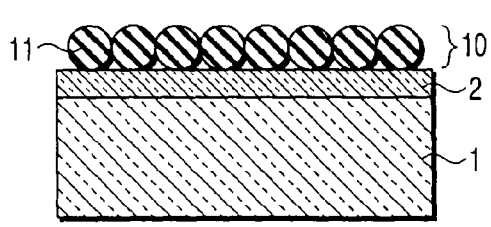
FIG. 7 is a cross-sectional view illustrating a step next to the step shown in FIG. 6.

Further, as shown in FIG. 7, particles 11 are placed on the base material layer 2 to form a particle monolayer 10. The particle monolayer 10 can be formed through procedures wherein a dispersion of particle is coated on the base material layer 2 by a method such as casting, spin-coating, dip-coating, etc., and then the solvent is dried away. During the process for drying the solvent, the particles aggregate densely due to intermolecular forces between the particles. In most cases, the particles 11 aggregate into a configuration of triangular pattern. On this occasion, if the drying rate of solvent is too slow, it may become difficult to introduce defect into the particle monolayer in the middle of the aggregation, thus making it difficult to obtain a sequence of particles which is required to obtain according to one embodiment of the present invention.

Therefore, it is preferable to form the particle monolayer by a coating method which enables a high-drying rate of solvent such as a spin coating method. When the dispersion medium for particles is water, the spin coating may be simply required to be performed at a rotational velocity of not less than 1000 rpm for about one minute. When a dispersion medium which is high in volatility such as alcohol is to be employed, the spin coating may be simply required to be performed at a rotational velocity of not less than 500 rpm for about one minute. If a casting method or a dip-coating method is to be employed, the drying rate of solvent may be accelerated by heating a dispersion liquid of particles coated in advance at temperature equal to or higher than the boiling point of the dispersion medium over a hot plate.

The particle diameter of particles 11 should desirably be equivalent to the periodicity of the recessed and projected portions to be formed. As for the materials for the particles 11, they should preferably be those excellent in etching resistance to an etching gas to be employed on the occasion of etch-working the base material layer 2. The etching gas to be employed on the occasion of etching the base material layer 2 should preferable be such that enables the selectivity ratio between the base material layer 2 and the particles 11 to become not less than 0.5, more preferably not less than 1.0. If this selectivity ratio is less than 0.5, the particles 11 may be etched away before the pattern of particle monolayer is transcribed to the base material layer 2, thus rendering the pattern transcription difficult to perform.

If the particles 11 and the base material layer 2 are both made of the same material, it may become difficult to sufficiently secure the etching selectivity ratio. In this case, a pattern transfer layer having an etching selectivity ratio to the base material layer and the particles is interposed between the base material layer and the particles, and then, the pattern of the particle monolayer is once transcribed onto the pattern transfer layer and thereafter the transcribed pattern of the pattern transfer layer is employed as an etch mask to create the recessed and projected portions in the base material layer. For example, in the case where the recessed and projected portions are created on a glass substrate by using a pattern of silica particle monolayer as a mask, an organic polymer layer having a main chain constituted by carbon atom may be employed as a material for the pattern transfer layer.

Figure 8:
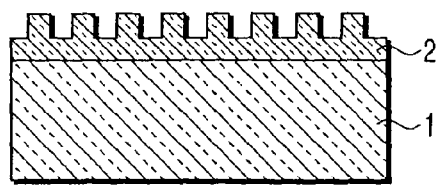
FIG. 8 is a cross-sectional view illustrating a step next to the step shown in FIG. 7.

The recessed and projected portions can be formed on the surface of the base material layer 2 as shown in FIG. 8 by using a particle monolayer as an etch mask and by performing anisotropic etching such as a reactive ion etching. In the case of isotropic etching, an etching gas may enter into a portion below the particles 11, thereby making it impossible to satisfactorily create desirable recessed and projected portions. Under some circumstances, the particles 11 may be selectively etched to reduce the particle diameter and then the resultant particles having a reduced particle diameter is employed as an etch mask to perform the etching of the base material layer 2. As a result, the occupation ratio of the projected portions of the recessed and projected portions can be changed.

Subsequent to the step of forming the recessed and projected portions on the base material layer 2, the particles 11 left remained may be selectively removed by etching or may be washed away by using a washing solution, etc. For example, when the particles 11 are formed of an organic material, the residual particles 11 can be selectively removed by oxygen ashing. Alternatively, the residual particles 11 can be washed away by ultrasonic cleaning using, as a washing solution, pure water or alcohol for example. When a pattern of particle monolayer is to be transcribed onto a pattern transfer layer, the residuals of the pattern transfer layer can be removed in the same manner as described above.

Figure 9:
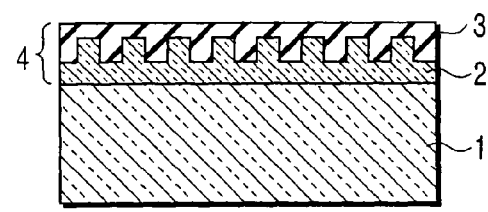
FIG. 9 is a cross-sectional view illustrating a step next to the step shown in FIG. 8.

Then, the recessed portions between neighboring projected portions of the recessed and projected portions formed on the base material layer 2 are filled with a medium 3 to create a diffraction grating portion 4 as shown in FIG. 9. As for the medium 3 to be employed in this filling, there is not any particular limitation as long as the medium 3 is transparent and has a different refractive index from that of the base material layer 2. The difference in refractive index between the base material layer 2 and the medium 3 should preferably be about 0.1 or more. For example, when the base material layer 2 is made of glass (refractive index: about 1.5), the medium 3 can be formed of zinc oxide (refractive index: about 2.0), etc. As for the filling method, it is possible to employ a wet processes including a spin-coating method, a dip-coating method, a bar coating method, a sol-gel method, etc.; or a dry processes such as a sputtering method, a vacuum deposition method, a plasma CVD method, etc. If an emission portion 8 is to be formed immediately on the diffraction grating portion 4, problems such as the decrease in life of the EL device may be raised due to a concentration of the electric field that may occur as recessed and projected portions are created in the transparent electrode. In order to obviate such problems, the surface of the medium 3 after the employment thereof for filling the recessed portions should preferably be flat.

Figure 10:
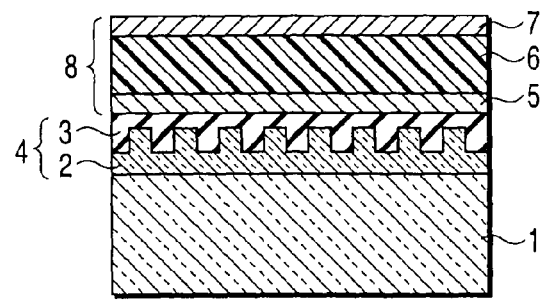
FIG. 10 is a cross-sectional view illustrating a step next to the step shown in FIG. 9.

As shown in FIG. 10, a first electrode 5, an organic layer 6 and a second electrode 7 are successively deposited on the diffraction grating 4 composed of the base material layer 2 and the medium 3, thereby forming an emission portion 8. As for the method of creating the emission portion 8, there is not any particular limitation and hence can be created using any conventional method. The electrodes 5 and 7 can be formed by ordinary sputtering method or vacuum deposition method. The organic layer 6 can be formed by using any conventional method such as a sputtering method, a vacuum deposition method, a spin coating method, a bar coating method, a screen printing method, etc.

By going through the aforementioned steps, a bottom emission type organic EL device as shown in FIG. 1 can be obtained. If required, a protective layer may be deposited after each step. This protective layer can be deposited to a thickness of about 10 to 1000 nm by using silicon nitride, etc.

Incidentally, in the case of top emission type organic EL device as shown in FIG. 3, the diffraction grating 4 can be formed subsequent to the formation of the emission portion 8 on the substrate 1. The manner of executing each of the steps is fundamentally the same as that employed in the case of the bottom emission type organic EL device.

In the method described above, a particle monolayer is employed as an etch mask to form the recessed and projected portions on the base material layer. Therefore, it is preferable that the particle monolayer is free from a particle multilayer. Even with respect to a region of large area, it is desired to form the particle monolayer at a high throughput. By using the method explained below, a particle monolayer having these features can be formed.

FIGS. 11 to 16 illustrate one example of process flow of the method of forming a particle monolayer according to another embodiment of the present invention.

Figure 11:
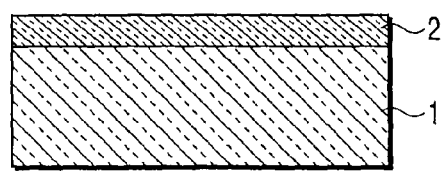
FIG. 11 is a cross-sectional view illustrating one step in the manufacture of particle monolayer in the manufacturing method of an organic EL device according to another embodiment of the present invention.

As shown in FIG. 11, a base material layer 2 is formed on a substrate 1 according to the procedure described above, and as shown in FIG. 12, a particulate-trapping layer 12 is formed on the base material layer 2. As for the material constituting the particle-trapping layer 12, there is not any particular limitation as long as the material comprises a high-molecular compound and meets the following requirements. Namely, (1) The material is capable of exhibiting fluidity at least once as it is heated; (2) The glass transition temperature of the material is lower than any of the glass transition temperature, melting point and sintering temperature of the particles; and (3) The material cannot be damaged by a dispersion liquid of particles or by a washing solution and hence, cannot be dissolved, peeled off or surface-roughened by these liquid or solution.

As for the polymer, it may be either an organic polymer or an inorganic polymer, the molecular weight of these polymers being optionally selected. More specifically, the weight average molecular weight (Mw) of the polymer can be selected from the range of 100-100000. Although it is possible to incorporate an additive such as a plasticizer into the polymer, an organic thermoplastic polymer containing an additive as required can be generally employed. Further, it is also possible to employ a B-staged thermosetting resin. Although there is not any problem in the case of the bottom emission type EL device, it is required in the case of the top emission type EL device to form the particle-trapping layer 12 subsequent to the formation of the emission portion on the substrate. Therefore, in order to prevent the organic layer of the emission portion from being damaged, the glass transition temperature of the particle-trapping layer 12 should preferably be confined to not higher than 100° C.

The particle-trapping layer 12 can be formed using any known methods. Namely, there is not any particular limitation with regard to the method of forming the particle-trapping layer 12. Generally however, the particle-trapping layer 12 can be formed by coating a solution of material for constituting the particle-trapping layer 12 on the base material layer 2. With respect to the method of coating such a solution also, there is not any particular limitation and hence the solution can be coated using any known coating method such as a spin-coating method, a dipping method, a bar coating method, scan-coating method, etc. Among them, the spin-coating method is most preferable as it is capable of forming a thin film of nm level with the thickness of the film being controlled precisely. Further, if the particle-trapping layer 12 is to be formed on a substrate of large scale, the dipping method can be also suitably employed.

Since one of the objects is to create a particle monolayer, the particles included in the layer(s) over the first layer (the lowest layer) are redundant particles. Therefore, if it is desired to wash out such redundant particles, the particles of the first layer (particle monolayer) should preferably be buried in the particle-trapping layer 12 to a depth corresponding to ⅓ of the diameter of particle. In this case, since the contacting area between the particle 11 and the particle-trapping layer 12 is increased, it is possible to secure a sufficient adhesion, thus preventing the particles from falling away in the washing step. The thickness of the particle-trapping layer 12 can be determined taking the aforementioned problem into consideration.

As shown in FIG. 13, particles 11 are deposited on the particle-trapping layer 12 to form the particle multilayer 13. More specifically, this particle multilayer 13 can be formed by a process wherein a particle dispersion liquid is coated on the particle-trapping layer 12 and then the solvent is evaporated. The particle dispersion liquid can be coated using any known coating method such as a spin-coating method, a dipping method, a bar coating method, scan-coating method, etc.

Although there is not any particular limitation with respect to the coating method of the particle dispersion liquid, the temperature in the step of coating should preferably be not higher than the glass transition temperature of the particle-trapping layer 12.

With respect to the temperature on the occasion of drying the coated layer, it should preferably be not higher than the glass transition temperature of the particle-trapping layer 12. As for the method of drying the layer of particle, there is not any particular limitation and hence various methods such as air drying, heat drying, drying using a gas flow such as a nitrogen gas flow, etc., can be employed.

By performing the coating step and drying step at a temperature not higher than the glass transition temperature of the particle-trapping layer 12 as described above, it is possible to prevent the particles 11 from adhering to the particle-trapping layer 12 through blocking for instance. In the course of process where the particle dispersion liquid that has been coated is being dried, the particles 11 densely aggregate due to the surface tension of the particle dispersion liquid, thereby forming the particle multilayer 13 filled with densely aggregated particles 11 on the particle-trapping layer 12. As far as the processes up to this step are performed at a temperature not higher than the glass transition temperature of the particle-trapping layer 12, it is possible to enable the particle multilayer 13 to be simply mounted on the particle-trapping layer 12 without generating blocking.

After the particle multilayer 13 has been formed as described above, the particle-trapping layer 12 is heated at a temperature not lower than the glass transition temperature thereof. As for the method of heating the particle-trapping layer 12, there is not any particular limitation and hence any known methods can be employed. For example, the particle-trapping layer 12 may be heated by placing the substrate on a hot plate or heated in a heating furnace of predetermined temperature. Alternatively, the particle-trapping layer 12 may be heated by electromagnetic induction heating using microwave, infrared irradiation or laser beam irradiation.

The heating of the particle-trapping layer 12 should preferably be performed from the substrate side, i.e. which is opposite to the side where the particle multilayer 13 is formed. Because if the particle-trapping layer 12 is heated from the side where the particle multilayer 13 is formed, the particles are more likely to be excessively heated, thereby generating the fusion among the particles or the sintering of the particles. Whereas when the particle-trapping layer 12 is heated from the substrate side, it can be efficiently heated without substantially heating the particle multilayer 13.

The particle-trapping layer 12 is fluidized as it is heated, thereby enabling, by the effect of capillary force, the particle-trapping layer 12 to ooze upward through the interstice in the particle multilayer 13. The height of the particle-trapping layer 12 thus oozed up may be determined by the volume of the particle-trapping layer 12 before the oozing thereof and by the volume of interstice among the particles. As shown in FIG. 14, the particle multilayer 13 is sunk and buried in the particle-trapping layer 12 up to a height depending on thickness of the particle-trapping layer 12. The sinking of the particles 11 into the particle-trapping layer 12 can be accomplished within a short time. In most cases, heating of about one minute would be sufficient.

Thereafter, the particle multilayer 13 is subjected to washing using a washing liquid to remove the particles 11 locating at upper layers including the second layer, which are not buried in the particle-trapping layer 12, as shown in FIG. 15. The washing in this case should preferably be performed at a temperature less than the glass transition temperature of the particle-trapping layer 12. If the washing is performed at a temperature not lower than the glass transition temperature of the particle-trapping layer 12, the particle-trapping layer 12 would be softened, causing the buried particles to fall off or causing the particles 11 that have been once washed out to readhere to the particle multilayer 13.

As for the washing liquid, there is not any particular limitation and hence water, various kinds of organic solvents or mixtures thereof can be employed. As for the organic solvent, it is possible to employ an alcoholic solvent such as methyl alcohol, ethyl alcohol, isopropyl alcohol, etc. An additive such as a surfactant may be incorporated into the washing liquid. Although there is no problem in the case of the bottom emission type device, it is desired in the case of the top emission type device that, since the particle-trapping layer 12 is required to be formed subsequent to the step of forming the emission portion, an aqueous washing liquid should not be used, since an aqueous washing liquid may invite the deterioration of the organic layer.

Finally, the particle-trapping layer 12 is removed by isotropic etching, etc. to obtain a particle monolayer 10 as shown in FIG. 16. When the material of the particles 11 and the material of the particle-trapping layer 12 are both constituted by the same kind of element as a major component such as in a case where they are both constituted by an organic polymer having carbon atoms as the main chain thereof, it is preferable that the particles 11 are more resistive to etching than the particle-trapping layer 12. If the etching resistance of the particles 11 is insufficient, the particles 11 would be removed before the particle-trapping layer 12 is removed, thus giving rise to the vanishing of the pattern.

The most characteristic step in the aforementioned method of forming the particle monolayer is the particle-burying step. The fluidized particle-trapping layer 12 is enabled to ooze upward through the particle multilayer 13 by the effect of capillary force, thereby burying the particles. On this occasion, it is not necessary to push the particles 11 into the particle-trapping layer 12 by applying a pressure to the particles 11. By simply heating the substrate, the particles are enabled to bury in the particle-trapping layer. In the case of the conventional method where the particles are pushed into a sticky layer, there is a problem that the particles will be non-uniformly (in-plane) pushed into the sticky layer. Whereas, according to the method of the embodiment of the present invention, it is possible, only through the control of thickness of the particle-trapping layer, to bury the particles with excellent in-plane uniformity. This method according to the embodiment of the present invention can be applied also to particles of nm size, to which the conventional pushing method has been hardly applicable.

This burying method utilizing the capillary force can be relatively easily performed as long as the wettability between the surface of particles and the constituent material of the particle-trapping layer is excellent. For example, if the surface of particles is hydrophilic, the constituent material of the particle-trapping layer is required to be made hydrophilic. However, this combination between the particles and the particle-trapping layer is not suited for use in the manufacture of the organic EL device according to one embodiment of the present invention. For example, in order to disperse the particles having a hydrophilic surface, the dispersion medium is required to be hydrophilic. If the particle-trapping layer is also hydrophilic, the particle-trapping layer may be damaged by the dispersion medium on the occasion of coating the particle dispersion liquid. As a result, the eluation or peel-off of the particle-trapping layer may generate, or irregularity may generate on the surface of the particle-trapping layer, these phenomena being actually confirmed by the present inventors. In the case where the washing out of redundant particles is required to be performed, the particle-trapping layer may be damaged on the occasion of washing since the washing liquid is required to be hydrophilic. In particular, when the thickness of the particle-trapping layer is relatively small (in the case where the particle diameter of the particles is in the order of nm), this trend would become more prominent.

In order to prevent the particle-trapping layer from being damaged, it is required to employ a hydrophobic particle-trapping layer if the surface of particles is hydrophilic, and to employ a hydrophilic particle-trapping layer if the surface of particles is hydrophobic. It has been generally considered that when the particles and the particle-trapping layer are combined in this manner, it is difficult to bury the particles in the particle-trapping layer. The reason for this can be ascribed to the fact that when the particle diameter of the particles is as small as less than 10 µm in particular, the influence of surface tension becomes predominant.

As a result of intensive studies made by the present inventors, it has been found out that even if the particles and the particle-trapping layer are combined in this manner, it is possible to bury the particles in the particle-trapping layer. Namely, by using the method according to one embodiment of the present invention, it becomes possible to form, at a high throughput, a particle layer portion of large area which is excellent in periodicity and filling property.

Next, the present invention will be explained with reference to examples which are not intended to limit the scope of the present invention.

EXAMPLE 1

A glass substrate (TEMPAX Float; refractive index: 1.48; SHOTT Nippon Co., Ltd.) was prepared as a substrate 1. As for the material for a particle monolayer, there was employed a dispersion liquid comprising one part by volume of a dispersion liquid of polystyrene particles having an average particle diameter of 0.4 µm (IMMUTEX series, concentration of solid matter=10%; JSR Co., Ltd.), and two parts by volume of water as a diluent. This dispersion liquid was spin-coated on the glass substrate for one minute at a rotational speed of 2000 rpm, thereby forming a particle monolayer 10.

As a result of observation of the particle monolayer 10 by a scanning type electron microscope (SEM), it was possible to confirm the formation of a plurality of first regions which were aggregated in a configuration of triangular grating as well as the formation of a particle monolayer including a second region consisting of a plurality of first regions each differing in translation vector and neighboring each other. Each of the first region was constituted by about 100-800 polystyrene particles.

By using a parallel plate plasma etching apparatus (DEM-451; Anelva Co., Ltd.), a pattern of the particle monolayer was transferred onto the glass substrate. First of all, by using the polystyrene particle monolayer as an etch mask, a reactive ion etching was performed for three minutes under the conditions of: $CF_4$ gas as an etching gas; 0.01 Torr in pressure; 30 sccm in flow rate; and 100 W in power; thereby transferring the pattern of the particle monolayer onto the glass substrate. The polystyrene particles left remained were completely removed by oxygen plasma etching.

Figure 17:
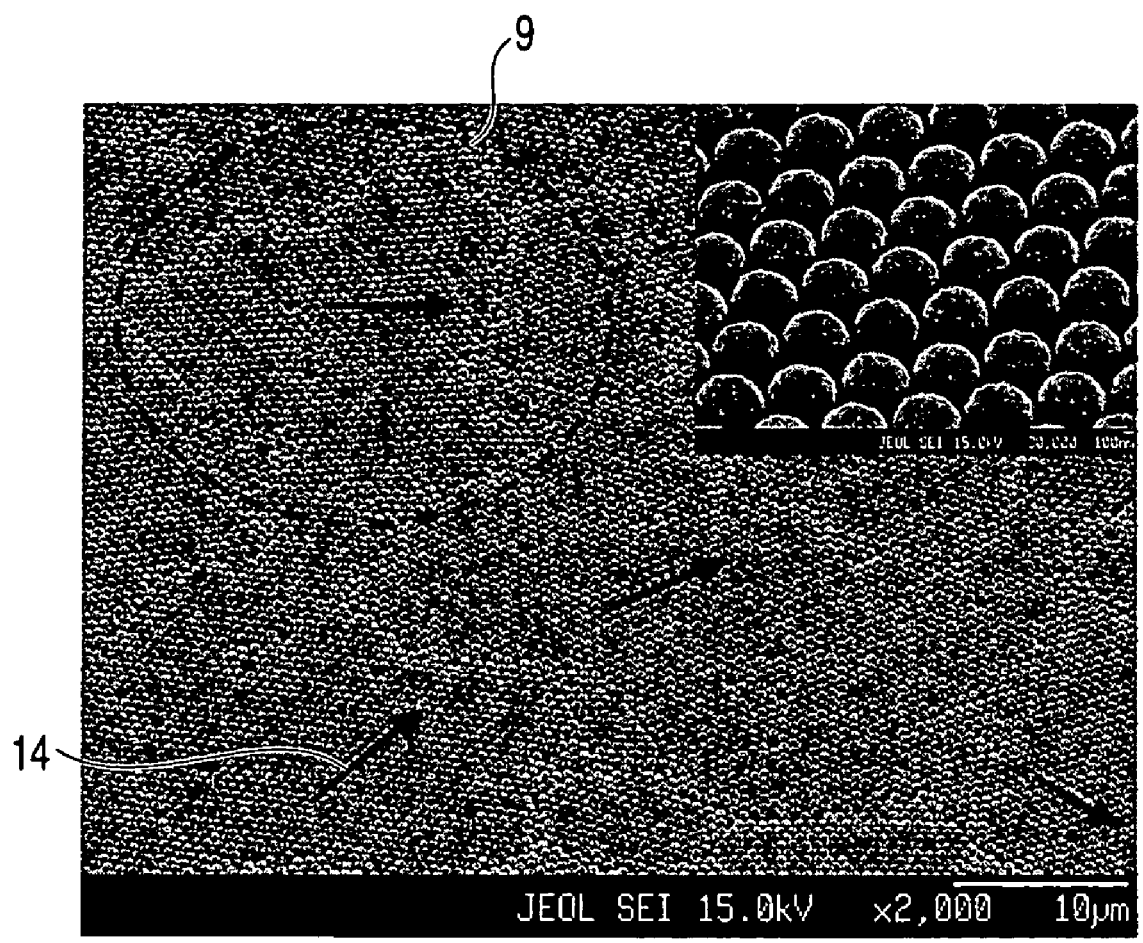
FIG. 17 is a photograph showing an SEM observation image of the recessed and projected portions prepared in Example 1.

FIG. 17 shows an SEM image of the glass substrate having the pattern thus transferred. It was confirmed that the pattern had a height of 100 nm and also confirmed the formation of recessed and projected portions on the glass substrate, wherein the recessed and projected portions were constituted by a second region consisting of a plurality of first regions neighboring each other and individually having a different primitive translation vector, each of the first regions consisting of about 100-800 recessed and projected portions having a periodicity of 0.4 μm.

On this glass substrate having these recessed and projected portions formed thereon, a coating material for ZnO thin film (Zn-05; Kojundo Chemical Lab Co. Ltd.) was coated by spin-coating method and dried. Thereafter, the dried layer was baked at a temperature of 550° C. to flatten the layer while filling the recessed portions of the recessed and projected portions on the glass substrate with ZnO (refractive index: 2.01), thus creating a diffraction grating 4.

Then, by sputtering method, ITO was deposited on this diffraction grating 4 to a thickness of 100 nm to form an anode. Further, by vacuum deposition method, α-NPD was deposited on this diffraction grating 4 to a thickness of 50 nm to form a hole transport layer and then, by vacuum deposition method, Alq3 was deposited on this diffraction grating 4 to a thickness of 80 nm to form an active layer. Finally, by vacuum deposition method, magnesium-silver alloy was co-deposited at a deposition rate ratio of 10:1 to a thickness of 200 nm to form a cathode, thus creating an emission portion 8. As a result, it was possible to obtain a bottom emission type organic EL device as shown in FIG. 1.

COMPARATIVE EXAMPLE 1

The same procedures as described in Example 1 were repeated except the diffraction grating was not created, thereby obtaining an organic EL device of Comparative Example 1.

COMPARATIVE EXAMPLE 2

The same procedures as described in Example 1 were repeated except the recessed and projected portions having a configuration of triangular grating with 0.4 μm in periodicity was formed all over the entire surface of the glass substrate, thereby obtaining an organic EL device of Comparative Example 2.

A DC voltage of 8 V was applied to each of the organic EL devices of Example 1, Comparative Example 1 and Comparative Example 2, thereby comparing the luminance as well as the luminance distribution in the emitting surface of these devices. As a result, the organic EL device of Example 1 exhibited a luminance of 2.48 times as high as that of the organic EL device of Comparative Example 1. Further, the organic EL device of Example 1 exhibited a luminance of 0.95 times the luminance of the organic EL device of Comparative Example 2. While the organic EL device of Comparative Example 2 exhibited non-uniformity in luminance distribution in the emitting surface, the organic EL device of Example 1 exhibited a uniform luminance distribution in the emitting surface.

EXAMPLE 2

A glass substrate (TEMPAX Float; refractive index: 1.48; SHOTT Nippon Co., Ltd.) was prepared as a substrate 1. By spin coating, a resist (OFPR-800, viscosity: 20 cp; Tokyo Ohka Co., Ltd.) was coated on the glass substrate 1 to form a pattern transfer layer 12. After the solvent was volatilized, the pattern transfer layer 12 was annealed for one hour in an oven of 250° C. in a nitrogen gas atmosphere to cure the resist, thus securing the solvent resistance thereof. On this pattern transfer layer 12, a particle monolayer 10 of silica particles having a particle diameter of 0.4 μm was formed. More specifically, this silica particle layer was formed as follows. Namely, an aqueous dispersion of 30 wt % silica particle having an average particle diameter of 0.4 μm (HIPRESICA N3N (trade name); Ube-Nitto Kasei Co., Ltd.) was prepared and polyvinyl alcohol was added as a surfactant to the aqueous dispersion, thereby preparing a dispersion liquid. This dispersion liquid was spin-coated on the pattern transfer layer 12 for one minute at a rotational speed of 2000 rpm, thereby forming the silica particle layer.

As a result of observation of the surface of the silica particle layer by the SEM, it was possible to confirm the formation of a plurality of first regions which were aggregated in a configuration of triangular grating as well as the formation of a particle monolayer comprising a second region consisting of a plurality of first regions each differing in translation vector and neighboring each other. Each of the first region was constituted by about 50-800 silica particles.

By using a parallel plate plasma etching apparatus (DEM-451; Anelva Co., Ltd.), a pattern of the particle monolayer was transcribed onto the resist. Since the silica particles were densely aggregated and the underlying pattern transfer layer was hardly visible, each of the silica particles was reduced in size down to 0.2 μm in diameter by reactive ion etching which was performed for eight minutes under the conditions of: $CF_4$ gas as an etching gas; 0.01 Torr in pressure; 30 sccm in flow rate; and 100 W in power.

By using a pattern of sequence of the silica particles that had been reduced in particle size as an etch mask, a reactive ion etching was performed for two minutes under the conditions of: $O_2$ gas as an etching gas; 0.01 Torr in pressure; 30 sccm in flow rate; and 100 W in power; thereby transferring the pattern onto the pattern transfer layer 12. Further, by using the pattern transfer layer 12 having the pattern transferred thereto as an etch mask, a reactive ion etching was performed for six minutes under the conditions of: $CF_4$ gas as an etching gas; 0.01 Torr in pressure; 30 sccm in flow rate; and 100 W in power; thereby forming the recessed and projected portions on the surface of the glass substrate. The residual pattern transfer layer as well as silica particles left remained thereon was entirely removed by oxygen plasma etching. It was confirmed that the recessed and projected portions had a height of 200 nm and also confirmed the formation of recessed and projected portions on the glass substrate, wherein the recessed and projected portions were constituted by a second region consisting of a plurality of first regions neighboring each other and individually having a different primitive translation vector, each of the first regions consisting of about 50-800 recessed and projected portions having a periodicity of 0.4 μm.

On this glass substrate having these recessed and projected portions formed thereon, a coating material for ZnO thin film (Zn-05; Kojundo Chemical Lab Co. Ltd.) was coated by spin-coating method and dried. Thereafter, the dried layer was baked at a temperature of 550° C. to flatten the layer while filling the recessed portions of the recessed and projected portions on the glass substrate with ZnO (refractive index: 2.01), thus creating a diffraction grating 4.

Then, by sputtering method, ITO was deposited on this diffraction grating 4 to a thickness of 100 nm to form an anode. Further, by vacuum deposition method, A-NPD was deposited on this diffraction grating 4 to a thickness of 50 nm to form a hole transport layer and then, by vacuum deposition method, Alq3 was deposited on this diffraction grating 4 to a thickness of 80 nm to form an active layer. Finally, by vacuum deposition method, magnesium-silver alloy was co-deposited at a deposition rate ratio of 10:1 to a thickness of 200 nm to form a cathode, thus creating an emission portion 8. As a result, it was possible to obtain a bottom emission type organic EL device as shown in FIG. 1.

A DC voltage of 8V was applied to each of the organic EL devices of Example 2, Comparative Example 1 and Comparative Example 2, thereby comparing the luminance as well as the luminance distribution in the emitting surface of these devices. As a result, the organic EL device of Example 2 exhibited a luminance of 2.19 times as high as that of the organic EL device of Comparative Example 1. Further, the organic EL device of Example 2 exhibited a luminance of 0.84 times the luminance of the organic EL device of Comparative Example 2. While the organic EL device of Comparative Example 2 exhibited non-uniformity in luminance distribution in the emitting surface, the organic EL device of Example 2 exhibited a uniform luminance distribution in the emitting surface.

EXAMPLE 3

By spin coating, a toluene solution of poly-α-methylstyrene was coated on a glass substrate (TEMPAX Float; refractive index: 1.48; SHOTT Nippon Co., Ltd.) employed as a substrate 1 to form a particle-trapping layer 12 having a thickness of 90 nm.

On this particle-trapping layer 12, a particle multilayer 13 of polystyrene particles having a particle diameter of 0.4 μm was deposited on the particle-trapping layer 12. This polystyrene particle multilayer was formed by a process wherein a dispersion liquid comprising one part by volume of a dispersion liquid of polystyrene particles having an average particle diameter of 0.4 μm (IMMUTEX series, concentration of solid matter=10%; JSR Co., Ltd.), and two parts by volume of methanol as a diluent was spin-coated on the poly-α-methylstyrene, and the solvent was completely dried, thereby forming the polystyrene particle multilayer. Since the glass transition temperature of poly-α-methylstyrene was about 50° C., the formation of the polystyrene particle multilayer was performed at a temperature lower than this glass transition temperature, i.e., room temperature (25° C.).

As a result of observation of the surface of the polystyrene particle multilayer by a scanning electron microscope (SEM), it was confirm that the polystyrene particle multilayer consisting of 3-layer was formed. Further, the substrate was heated for one minute at a temperature of 90° C. so as to bury the lowest particle layer. Then, the substrate was subjected to ultrasonic washing in pure water of 25° C. for 10 minutes to wash the second and third particle layers.

When the substrate was observed by SEM after the washing, it was confirmed that the particles of the second and third layers were found completely removed, thereby creating a particle monolayer comprising a plurality of first regions aggregated in a configuration of triangular grating and neighboring at random. The periodic structure portion of each of the first regions was constituted by about 50-1000 polystyrene particles. It was also confirmed that due to the capillary force, poly-α-methylstyrene was caused to swell up to a height of 250 nm of the particle monolayer.

By using a parallel plate plasma etching apparatus (DEM-451; Anelva Co., Ltd.), a pattern of the particle monolayer was transferred onto the glass substrate 1. First of all, a plasma etching was performed for 30 seconds under the conditions of: $O_2$ gas as an etching gas; 0.01 Torr in pressure; 30 sccm in flow rate; and 100 W in power; thereby removing the poly-α-methylstyrene. On this occasion, the polystyrene particles were also etched, thus reducing the particle diameter thereof down to about 0.3 μm.

Further, by using the polystyrene particle monolayer that had been left remaining on the glass substrate as an etch mask, a reactive ion etching was performed for three minutes under the conditions of: $CF_4$ gas as an etching gas; 0.01 Torr in pressure; 30 sccm in flow rate; and 100 W in traveling wave output; thereby transferring the pattern of the particle monolayer onto the glass substrate. The residual polystyrene particles left remained thereon were entirely removed by oxygen plasma etching. It was confirmed that the height of the pattern was 100 nm and also confirmed the formation of recessed and projected portions on the glass substrate, wherein the recessed and projected portions were constituted by a second region consisting of a plurality of first regions neighboring each other and individually having a different primitive translation vector, each of the first regions consisting of about 50-1000 recessed and projected portions having a periodicity of 0.4 μm.

On this glass substrate having these recessed and projected portions formed thereon, a coating material for ZnO thin film (Zn-05; Kojundo Chemical Lab Co. Ltd.) was coated by spin-coating method and dried. Thereafter, the dried layer was baked at a temperature of 550° C. to flatten the layer while filling the recessed portions of the recessed and projected portions on the glass substrate with ZnO (refractive index: 2.01), thus creating a diffraction grating 4.

Then, by sputtering method, ITO was deposited on this diffraction grating 4 to a thickness of 100 nm to form an anode. Further, by vacuum deposition method, α-NPD was deposited on this diffraction grating 4 to a thickness of 50 nm to form a hole transport layer and then, by vacuum deposition method, Alq3 was deposited on this diffraction grating 4 to a thickness of 80 nm to form an active layer. Finally, by vacuum deposition method, magnesium-silver alloy was co-deposited at a deposition rate ratio of 10:1 to a thickness of 200 nm to form a cathode, thus creating an emission portion 8. As a result, it was possible to obtain a bottom emission type organic EL device as shown in FIG. 1.

A DC voltage of 8V was applied to each of the organic EL devices of Example 3, Comparative Example 1 and Comparative Example 2, thereby comparing the luminance as well as the luminance distribution in the emitting surface of these devices. As a result, the organic EL device of Example 3 exhibited a luminance of 2.52 times as high as that of the organic EL device of Comparative Example 1. Further, the organic EL device of Example 3 exhibited a luminance of 0.96 times the luminance of the organic EL device of Comparative Example 2. While the organic EL device of Comparative Example 2 exhibited non-uniformity in luminance distribution in the emitting surface, the organic EL device of Example 3 exhibited a uniform luminance distribution in the emitting surface.

EXAMPLE 4

By spin coating, a resist (OFPR-800, viscosity: 20 cp; Tokyo Ohka Co., Ltd.) was coated on a glass substrate (TEMPAX Float; refractive index: 1.48; SHOTT Nippon Co., Ltd.) employed as a substrate 1 to form a film. After the solvent was volatilized, the layer was annealed for one hour in an oven of 250° C. in a nitrogen gas atmosphere to cure the resist, thus securing the solvent resistance thereof, thereby forming a pattern transfer layer. On this pattern transfer layer, a toluene solution of poly-α-methylstyrene was coated by spin coating method to form a particle-trapping layer 12 having a thickness of 90 nm.

On this particle-trapping layer 12 was deposited a particle multilayer of silica particles having a particle diameter of 0.4 µm was formed. More specifically, this silica particle layer was formed as follows. Namely, an aqueous dispersion of 30 wt % silica particle having an average particle diameter of 0.4 µm (HIPRESICA N3N (trade name); Ube Nitto Kasei Co., Ltd.) was prepared and polyvinyl alcohol was added as a surfactant to the aqueous dispersion, thereby preparing a dispersion liquid. This dispersion liquid was spin-coated on the particle-trapping layer 12 and then the solvent was completely volatilized to form the silica particle multilayer. Since the glass transition temperature of poly-α-methylstyrene was about 50° C., the formation of the polystyrene particle multilayer was performed at a temperature lower than this glass transition temperature, i.e. room temperature (25° C.).

As a result of observation of the surface of polystyrene particle multilayer by a scanning electron microscope (SEM), it was confirm that the polystyrene particle multilayer consisting of 5-layer was formed. Further, the substrate was heated for one minute at a temperature of 110° C. so as to bury the lowest particle layer. Then, the substrate was subjected to ultrasonic washing in pure water of 40° C. for 5 minutes to wash all of the particle layers except the lowest particle layer.

When the substrate was observed by the SEM after the washing, it was confirmed that the particles of the upper layers were found completely removed, thereby creating a particle monolayer formed of a second region comprising a plurality of first regions aggregated in a configuration of triangular grating and neighboring each other, the first regions individually having a different primitive translation vector. Each of the first regions was constituted by about 30-600 polystyrene particles. It was also confirmed that due to the capillary force, poly-α-methylstyrene was caused to swell up to a height of 250 nm of the particle monolayer.

By using a parallel plate plasma etching apparatus (DEM-451; Anelva Co., Ltd.), a pattern of the particle monolayer was transcribed onto the resist. First of all, a plasma etching was performed for 30 seconds under the conditions of: $O_2$ gas as an etching gas; 0.01 Torr in pressure; 30 sccm in flow rate; and 100 W in power; thereby removing the poly-α-methylstyrene. Since silica particles could not be etched away in the oxygen plasma etching, the particles were permitted to remain aggregated and hence the underlying pattern transfer layer was hardly visible. Then, reactive ion etching was performed for 8 minutes under the conditions of: $CF_4$ gas as an etching gas; 0.01 Torr in pressure; 30 sccm in flow rate; and 100 W in traveling wave output; thereby reducing the particle diameter of the silica particles to a diameter of 0.2 µm.

By using a pattern of the silica particles that had been reduced in particle size as an etch mask, a reactive ion etching was performed for two minutes under the conditions of: $O_2$ gas as an etching gas; 0.01 Torr in pressure; 30 sccm in flow rate; and 100 W in power; thereby transferring the monoparticulate pattern onto the pattern transfer layer. Further, by using the pattern transfer layer having the pattern transferred thereto as an etch mask, a reactive ion etching was performed for six minutes under the conditions of: $CF_4$ gas as an etching gas; 0.01 Torr in pressure; 30 sccm in flow rate; and 100 W in traveling wave output; thereby forming the recessed and projected portions on the surface of glass substrate. The residual pattern transfer layer as well as silica particles left remained thereon was entirely removed by oxygen plasma etching.

As a result, the recessed and projected portions were found to have a height of 200 nm and the recessed and projected portions formed on the glass substrate were constituted by a second region consisting of a plurality of first regions neighboring each other and individually having a different primitive translation vector, each of the first regions consisting of about 30-600 recessed and projected portions having a periodicity of 0.4 µm.

On this glass substrate having these recessed and projected portions formed thereon, a coating material for ZnO thin film (Zn-05; Kojundo Chemical Lab Co. Ltd.) was coated by spin-coating method and dried. Thereafter, the dried layer was baked at a temperature of 550° C. to flatten the layer while filling the recessed portions of the recessed and projected portions on the glass substrate with ZnO (refractive index: 2.01), thus creating a diffraction grating 4.

Then, by sputtering method, ITO was deposited on this diffraction grating 4 to a thickness of 100 nm to form an anode. Further, by vacuum deposition method, α-NPD was deposited on this diffraction grating 4 to a thickness of 50 nm to form a hole transport layer and then, by vacuum deposition method, Alq3 was deposited on this diffraction grating 4 to a thickness of 80 nm to form an active layer. Finally, by vacuum deposition method, magnesium-silver alloy was co-deposited at a deposition rate ratio of 10:1 to a thickness of 200 nm to form a cathode, thus creating an emission portion 8. As a result, it was possible to obtain a bottom emission type organic EL device as shown in FIG. 1.

A DC voltage of 8V was applied to each of the organic EL devices of Example 4, Comparative Example 1 and Comparative Example 2, thereby comparing the luminance as well as the luminance distribution in the emitting surface of these devices. As a result, the organic EL device of Example 4 exhibited a luminance of 2.32 times as high as that of the organic EL device of Comparative Example 1. Further, the organic EL device of Example 4 exhibited a luminance of 0.88 times the luminance of the organic EL device of Comparative Example 2. While the organic EL device of Comparative Example 2 exhibited non-uniformity in luminance distribution in the emitting surface, the organic EL device of Example 4 exhibited a uniform luminance distribution in the emitting surface.

According to one aspect of the present invention, it is possible to provide a method of manufacturing an organic electroluminescent device which is excellent in light extraction efficiency and capable of preventing the generation of non-uniformity in luminance in the emission surface at low manufacturing cost.

The present invention can be suitably applied to optical devices such as an organic EL device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic electroluminescent device, comprising:
   an emission portion comprising a first electrode and a second electrode and an organic layer sandwiched between the first and second electrodes; and
   a diffraction grating disposed neighboring on the emission portion, the diffraction grating being constituted by a base material layer having recessed and projected portions on a surface thereof, and a medium deposited on the base material layer to bury the recessed portions of the recessed and projected portions, the diffraction grating having first regions and second regions, each of the first regions being a portion of a planar section of the base material layer and comprising a group of the recessed and projected portions, the second region being a portion of the planar section of the base material layer which includes the plurality of the first regions wherein the diffraction grating has different periodic axes over an entire region of the emission portion, and consisting of an aggregate of a plurality of the first regions, there being at least 5 pairs of recessed and projected portions within each of the first regions being arranged with two-dimensional periodicity in a same direction parallel with the substrate and with a primitive translation vector of a predetermined direction, the predetermined direction of the primitive translation vector of the recessed and projected portions of each of the first regions differing from each other, and the medium being a different material from that of a neighboring transparent electrode material.

2. The organic electroluminescent device according to claim 1, wherein a plurality of pairs of recessed and projected portions of the first regions are formed in two-dimensional periodicity, and the number of the pairs of recessed and projected portions, in the direction of a primitive translation vector, is confined within the range of 5 to 5000.

3. The organic electroluminescent device according to claim 2, wherein the number of the pairs of recessed and projected portions of the first region is 10 or more.

4. The organic electroluminescent device according to claim 2, wherein the number of the pairs of recessed and projected portions in the first region is not more than 1000.

5. The organic electroluminescent device according to claim 1, wherein a plurality of pairs of recessed and projected portions of the first region are provided with a periodicity in the direction of a primitive translation vector, and a length of the periodicity is confined within the range of 0.1 μm to 5 μm, and a height of the projected portions is confined within the range of 50 nm to 20 μm.

6. The organic electroluminescent device according to claim 1, wherein there are a plurality of intervals between respective recessed portions and projected portions and each of the intervals is within the range of 80% to 120% of an average interval of the plurality of intervals.

7. The organic electroluminescent device according to claim 1, wherein there are a plurality of heights of respective projected portions in the first region and each of the heights is within the range of 80% to 120% of an average height of the plurality of heights.

8. The organic electroluminescent device according to claim 1, wherein the organic electroluminescent device comprises a substrate and the diffraction grating is positioned between the substrate and the emission portion.

9. The organic electroluminescent device according to claim 1, wherein the organic electroluminescent device comprises a substrate and the diffraction grating is positioned via the emission portion above the substrate.

10. The organic electroluminescent device according to claim 1, wherein the base material layer has a refractive index which is different from that of the medium.

* * * * *